United States Patent
Rebel et al.

(10) Patent No.: US 8,446,227 B2
(45) Date of Patent: May 21, 2013

(54) METHODS AND APPARATUS FOR TUNING DEVICES HAVING MECHANICAL RESONATORS

(75) Inventors: Reimund Rebel, Maricopa, AZ (US); Klaus Juergen Schoepf, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 12/699,095

(22) Filed: Feb. 3, 2010

(65) Prior Publication Data

US 2010/0308931 A1 Dec. 9, 2010

Related U.S. Application Data

(60) Provisional application No. 61/149,815, filed on Feb. 4, 2009, provisional application No. 61/184,138, filed on Jun. 4, 2009.

(51) Int. Cl.
*H03B 5/30* (2006.01)

(52) U.S. Cl.
USPC .................. 331/107 A; 331/116 R; 331/154; 331/177 R

(58) Field of Classification Search
USPC ............... 331/107 A, 116 R, 116 FE, 116 M, 331/154, 155, 156, 158, 135, 177 R, 177 V, 331/181
See application file for complete search history.

(56) References Cited

U.S. PATENT DOCUMENTS

| | | | |
|---|---|---|---|
| 4,503,434 A | 3/1985 | Luh | |
| 4,521,702 A | 6/1985 | Kleinberg | |
| 4,581,592 A | 4/1986 | Bennett | |
| 5,416,447 A | 5/1995 | Andres et al. | |
| 5,874,866 A | 2/1999 | Satoh et al. | |
| 5,914,553 A | 6/1999 | Adams et al. | |
| 5,939,918 A | 8/1999 | McGarry et al. | |
| 5,939,956 A | 8/1999 | Arimura et al. | |
| 6,124,765 A | 9/2000 | Chan et al. | |
| 6,577,040 B2 | 6/2003 | Nguyen | |
| 6,739,190 B2 | 5/2004 | Hsu et al. | |
| 6,741,147 B2 | 5/2004 | Harris | |

(Continued)

FOREIGN PATENT DOCUMENTS

| | | |
|---|---|---|
| EP | 0375360 A2 | 6/1990 |
| EP | 1505722 A2 | 2/2005 |

(Continued)

OTHER PUBLICATIONS

Driscoll, M.M., "Linear Frequency Tuning of Saw Resonators," *IEEE Trans. on Ultrasonics, Ferroelectrics and Frequency Control*:38(4):366-369 (1991).

(Continued)

*Primary Examiner* — Ryan Johnson

(74) *Attorney, Agent, or Firm* — Wolf, Greenfield & Sacks, P.C.

(57) ABSTRACT

Methods and apparatus for tuning devices having mechanical resonators are described. In one implementation, a mechanical resonator and a phase shifter are configured in a feedback loop, so that the phase shifter shifts the phase of the resonator output signal. The amount of phase shift induced by the phase shifter may be variable. In another implementation, an LC tuning subcircuit is coupled to a mechanical resonator. In some implementations, the LC tuning subcircuit has a variable capacitance. One or more of the apparatus described herein may be implemented as part, or all, of a microelectromechanical system (MEMS).

6 Claims, 9 Drawing Sheets

U.S. PATENT DOCUMENTS

| | | | |
|---|---|---|---|
| 6,828,713 | B2 | 12/2004 | Bradley et al. |
| 6,831,531 | B1 | 12/2004 | Giousouf et al. |
| 6,859,113 | B2 | 2/2005 | Giousouf et al. |
| 6,909,221 | B2 | 6/2005 | Ayazi et al. |
| 6,914,493 | B2 * | 7/2005 | Ash .................. 331/107 A |
| 6,943,484 | B2 | 9/2005 | Clark et al. |
| 6,954,020 | B2 | 10/2005 | Ma et al. |
| 6,995,622 | B2 | 2/2006 | Partridge et al. |
| 7,005,946 | B2 | 2/2006 | Duwel et al. |
| 7,092,687 | B2 | 8/2006 | Krupezevic et al. |
| 7,187,240 | B2 * | 3/2007 | Cathelin et al. ............ 331/2 |
| 7,211,926 | B2 | 5/2007 | Quevy et al. |
| 7,215,061 | B2 | 5/2007 | Kihara et al. |
| 7,248,128 | B2 | 7/2007 | Mattila et al. |
| 7,352,608 | B2 | 4/2008 | Mohanty et al. |
| 7,492,241 | B2 | 2/2009 | Piazza et al. |
| 7,504,909 | B2 | 3/2009 | Tada |
| 7,724,103 | B2 | 5/2010 | Feng et al. |
| 7,791,432 | B2 | 9/2010 | Piazza et al. |
| 7,932,789 | B2 | 4/2011 | Hay |
| 7,932,798 | B2 | 4/2011 | Tolle et al. |
| 2002/0075100 | A1 | 6/2002 | Katohno |
| 2002/0158700 | A1 | 10/2002 | Nemoto |
| 2003/0034852 | A1 | 2/2003 | Kobayashi et al. |
| 2004/0056728 | A1 | 3/2004 | Dent et al. |
| 2005/0073078 | A1 | 4/2005 | Lutz et al. |
| 2006/0152107 | A1 * | 7/2006 | Tanaka .................. 310/313 R |
| 2006/0255884 | A1 * | 11/2006 | Tanaka .................. 333/195 |
| 2007/0052324 | A1 * | 3/2007 | Chen et al. ............ 310/313 R |
| 2008/0048804 | A1 | 2/2008 | Volatier et al. |
| 2008/0143217 | A1 | 6/2008 | Ho et al. |
| 2008/0204153 | A1 | 8/2008 | Yoshida et al. |
| 2008/0272852 | A1 | 11/2008 | Six |
| 2009/0026882 | A1 | 1/2009 | Steeneken et al. |
| 2009/0108381 | A1 | 4/2009 | Buchwalter et al. |
| 2009/0108959 | A1 | 4/2009 | Piazza et al. |
| 2009/0144963 | A1 | 6/2009 | Piazza et al. |
| 2009/0243747 | A1 | 10/2009 | Gaidarzhy et al. |
| 2009/0294638 | A1 | 12/2009 | Mohanty et al. |
| 2010/0007443 | A1 | 1/2010 | Mohanty et al. |
| 2010/0134207 | A1 | 6/2010 | Mohanty et al. |
| 2010/0155883 | A1 | 6/2010 | Wenzler et al. |
| 2010/0181868 | A1 | 7/2010 | Gaidarzhy et al. |

FOREIGN PATENT DOCUMENTS

| | | |
|---|---|---|
| WO | WO 98/01948 A1 | 1/1998 |
| WO | WO 98/37635 A1 | 8/1998 |
| WO | WO 02/17481 A2 | 2/2002 |
| WO | WO 2005/029700 A1 | 3/2005 |
| WO | WO 2006/000611 A1 | 1/2006 |
| WO | WO 2006/083482 A2 | 8/2006 |
| WO | WO 2010/011288 A1 | 1/2010 |
| WO | WO 2010/077311 A1 | 7/2010 |
| WO | WO 2010/090731 A2 | 8/2010 |

OTHER PUBLICATIONS

Driscoll et al., "Voltage-controlled crystal oscillators," *IEEE Trans. on Electron Devices*:ED18(8):528-535 (1971).

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

International Search Report and Written Opinion for International Application No. PCT/US2010/000301 mailed Sep. 3, 2010.

International Search Report and Written Opinion for International Application No. PCT/US09/06587 mailed Feb. 26, 2010.

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

International Search Report from PCT/US2011/042777 mailed Oct. 21, 2011.

Liu, "A 2.7-V Dual-Frequency Single-Sideband Mixer," VLSI Circuits, 1998 Digest of Technical Papers, 1998 Symposium, Jun. 11-13, 1998, pp. 124-127.

* cited by examiner

METHODS AND APPARATUS FOR TUNING DEVICES HAVING MECHANICAL RESONATORS

RELATED APPLICATIONS

The present application claims the benefit under 35 U.S.C. §119(e) of U.S. Provisional Patent Application No. 61/149,815, filed on Feb. 4, 2009, and entitled "Methods and Apparatus for Tuning Oscillators", which is hereby incorporated herein by reference in its entirety. The present application also claims the benefit under 35 U.S.C. §119(e) of U.S. Provisional Patent Application No. 61/184,138, filed on Jun. 4, 2009, and entitled "Methods and Apparatus for Tuning Devices Having Mechanical Resonators", which is hereby incorporated herein by reference in its entirety.

BACKGROUND

1. Field

The technology described herein relates to methods and apparatus for tuning devices having mechanical resonators.

2. Related Art

Some electromechanical oscillators include a mechanical resonator coupled to an electronic driving circuit. The mechanical resonator has an inherent resonance frequency, the value of which depends on factors such as the size, shape, and material of the resonator. The electronic driving circuit produces a drive signal to drive the mechanical resonator.

A mechanical resonator, such as those used in some electromechanical oscillators, may be designed to have a desired resonance frequency. In particular, because the inherent resonance frequency of the mechanical resonator is determined, at least partially, by factors that are subject to design choice (i.e., size, shape, material, etc.), the mechanical resonator may be designed to have a desired resonance frequency by suitably designing those factors. However, due to manufacturing tolerances resulting in deviations of the design factors from their intended values, and due to variations arising during operation of the electromechanical oscillator (for example, temperature induced variations, ambient pressure variations, package-induced stress, material dependent stress), the mechanical resonator may not have the desired inherent resonance frequency in all situations.

To account for manufacturing tolerances and temperature induced shifts in the resonance frequency of the mechanical resonator, the electromechanical oscillator may be tuned. FIG. 1 illustrates a characteristic impedance curve of a resonator as a function of frequency, which curve is applicable to the mechanical resonators of typical electromechanical oscillators. The impedance is illustrated by line 102, and includes both a series resonance peak 104, occurring at a resonance frequency $f_{res}$, and a parallel resonance peak 106. In the case of electromechanical oscillators having a mechanical resonator, conventional tuning methods allow for tuning of the oscillator operation within a tuning range 108 between the series resonance peak and the parallel resonance peak. Because the conventional tuning range 108 occurs on only one side of the series resonance frequency, $f_{res}$, the accuracy of tuning of the oscillator around the series resonance frequency of the mechanical resonator is limited.

SUMMARY

According to one aspect of the technology described, a method of tuning a device having a mechanical resonator is provided. The method comprises producing an output signal of the mechanical resonator, shifting a phase of the output signal of the mechanical resonator to produce a phase-shifted signal having a different phase than the phase of the output signal of the mechanical resonator, and providing the phase-shifted signal to the mechanical resonator.

According to another aspect, a device comprises a mechanical resonator and a phase shifter. The mechanical resonator and the phase shifter are configured in a feedback loop.

According to another aspect, a method of tuning a device having a mechanical resonator is provided. The method comprises using a drive circuit to produce a drive signal for driving the mechanical resonator. The method further comprises providing the drive signal to an LC tuning subcircuit having an input coupled to the drive circuit and an output coupled to the mechanical resonator. The method further comprises varying a capacitance value of the LC tuning subcircuit.

According to another aspect, an electromechanical device comprises a mechanical resonator having a parasitic inductance and a parasitic capacitance. The device further comprises an electrical drive circuit configured to drive the mechanical resonator, and an LC tuning subcircuit comprising an inductor and a capacitor, the LC tuning subcircuit coupled to the mechanical resonator and configured to adjust a resonance frequency of the electromechanical device.

According to another aspect, a device comprises a mechanical resonator having a series resonance frequency, and a tuner coupled to the mechanical resonator and configured to adjust an operating frequency of the device to a frequency less than or greater than the series resonance frequency.

According to another aspect, a method of tuning a device having a mechanical resonator is provided. The method comprises producing a multi-ended output signal of the mechanical resonator, the multi-ended output signal comprising a first end and a second end. The method further comprises producing a phase-shifted signal by phase shifting at least one of the first end and the second end. The method further comprises providing the phase-shifted signal as an input signal to the mechanical resonator.

According to another aspect, a method of tuning a mechanical resonator of an oscillating circuit is provided. The method comprises producing an output signal of the mechanical resonator comprising a first end and a second end, amplifying and phase shifting the first end and second end by different amounts to produce a modified signal, and inputting the modified signal to the mechanical resonator.

DETAILED DESCRIPTION

Figure 1:
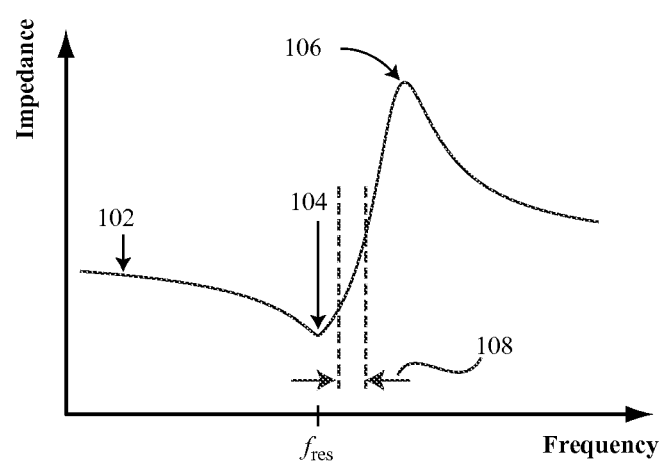
FIG. 1 shows an impedance curve for a resonator, and illustrates that conventional tuning methods allowed for tuning on only one side of the series resonance peak.

Applicant describes below tunable electromechanical devices having mechanical resonators. Some of the electromechanical devices described implement a phase shifter as a tuner to provide tuning capability, and others implement a tuning subcircuit formed of inductors and/or capacitors as a tuner. At least some of the devices may offer greater tuning flexibility and capability than that of conventional electromechanical oscillators, for example in that they may be tuned to exhibit resonant behavior below and above the series resonance frequency of the mechanical resonator.

According to one aspect of the technology described herein, an electromechanical device (e.g., an oscillator, a filter, a sensor, or other type of device) has a mechanical resonator that has a series resonance frequency, and the device is configured to allow for tuning of the device's frequency of operation on both sides of the series resonance frequency of the mechanical resonator. Thus, devices having mechanical resonators may be tuned to exhibit resonant behavior at a desired frequency even though the inherent resonance frequency of the mechanical resonator may not be equal to the desired resonance frequency, either because of manufacturing errors, temperature variations, or for any other reason (e.g., ambient pressure variations, package-induced stresses, or material-dependent stresses, among others). As a result, the need for strict manufacturing tolerances of the mechanical resonator may be relaxed, since the device may be accurately tuned to compensate for any deviations of the inherent resonance frequency of the mechanical resonator from the desired resonance frequency.

According to one embodiment, a device having a mechanical resonator includes a phase shifter configured to shift the phase of the input signal(s) to and/or output signal(s) from the mechanical resonator. In some embodiments the mechanical resonator is configured in a feedback loop, for example with the phase shifter, and inducing a phase difference between the input signal(s) and output signal(s) of the mechanical resonator operating at a first frequency may cause the mechanical resonator to shift its operation to a second frequency. By suitably selecting the amount of phase shift induced, the device may be operated to exhibit resonant behavior at a desired resonance frequency, which frequency may differ from the inherent resonance frequency of the mechanical resonator. According to some embodiments, the phase shifter may be configured to induce a suitable phase shift in the output signal(s) of the mechanical resonator and then provide the phase-shifted signal(s) back to the mechanical resonator as an input signal.

According to another embodiment, an electromechanical device comprises a mechanical resonator, a drive circuit, and an LC tuning subcircuit. The LC tuning subcircuit may be coupled between the mechanical resonator and the drive circuit in some embodiments, although other configurations are also possible. The LC tuning subcircuit may include either a variable inductor or a variable capacitor, or in some embodiments may include both a variable inductor and a variable capacitor. By suitably adjusting the relative reactances of the inductor and capacitor of the LC tuning subcircuit, the resonance frequency of the device may be adjusted to a desired value, regardless of whether that value differs from the inherent resonance frequency of the mechanical resonator.

The aspects of the technology described above, as well as additional aspects, will now be described in greater detail. It should be appreciated that these aspects can be used alone, all together, or in any combination of two or more, and thus are not limited in this respect. Also, various embodiments will be described as including devices having mechanical resonators. It should be appreciated that such embodiments apply to any suitable types of devices, including, but not limited to, oscillators, filters, and sensors.

Figure 2:
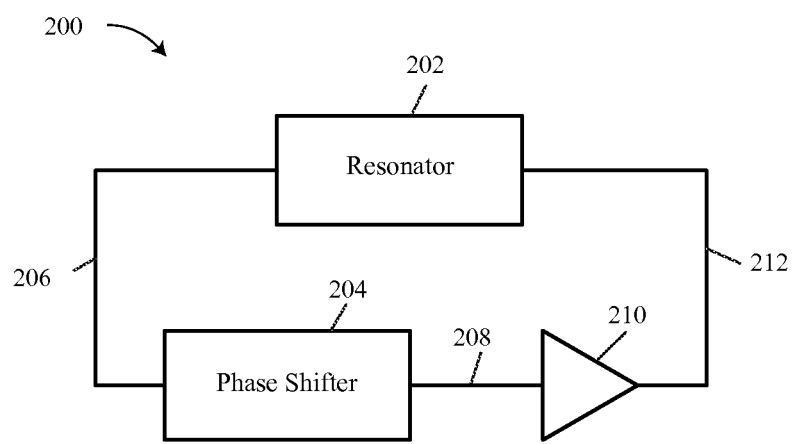
FIG. 2 illustrates a feedback loop comprising a mechanical resonator and a phase shifter according to one embodiment of the technology.

As mentioned, according to one aspect of the technology described herein, a device comprising a mechanical resonator is configured to enable tuning of the device's operating frequency on either side of the series resonance frequency of the mechanical resonator (i.e., above and below the series resonance frequency). FIG. 2 illustrates one non-limiting example of such a device (which, in some embodiments, may be an oscillator), according to one embodiment. The device 200 comprises a mechanical resonator 202 and a phase shifter 204, configured in a feedback loop.

The mechanical resonator 202 may be any type of mechanical resonator, such as a microelectromechanical system (MEMS), a nanoelectromechanical system (NEMS), a bulk acoustic wave (BAW) resonator, a surface acoustic wave (SAW) resonator, a film bulk acoustic resonator (FBAR), or any other suitable resonator, as the various aspects described herein are not limited in this respect. Suitable resonators have been described, for example, in PCT Patent Publication No. WO 2006/083482, and in U.S. patent application Ser. No. 12/142,254, filed Jun. 19, 2008 and published as U.S. Pat. Pub. No. 2009/0243747 on Oct. 1, 2009, all of which are incorporated herein by reference in their entireties.

In some embodiments, the mechanical resonator and/or the device including the mechanical resonator may be formed of two or more materials, for example using two or more material layers. Thus, the operation and resonance frequency of the mechanical resonator and/or device in these embodiments may vary due to material-dependent stresses, for example those stresses arising due to the use of materials having different expansion coefficients. However, not all embodiments are limited in this respect. Moreover, the mechanical resonator may be actuated and/or detected in any suitable manner, including, but not limited to, being actuated and/or detected by piezoelectric techniques, electrostatic techniques, magnetic techniques, thermal techniques, piezoresistive techniques, any combination of those techniques listed, or in any other suitable manner.

Similarly, the phase shifter 204 may be any suitable type of phase shifter for receiving an input signal and producing an output signal having a phase shifted relative to that of the input signal. It should be appreciated that phase shifter 204 may be a variable phase shifter according to some embodiments, such that the amount of phase shift provided by the phase shifter 204 may be varied.

With respect to FIG. 2, the mechanical resonator 202 may produce an output signal 206, having a phase, which output signal may be input to the phase shifter 204. The phase shifter 204, upon receiving the output signal 206 of the mechanical resonator 202, may shift the phase of the output signal 206 and produce a phase-shifted output signal 208. The phase-shifted output signal 208 may be identical to the resonator output signal 206, except for having a different phase. However, the various aspects described herein are not limited in this respect.

According to some embodiments, a gain factor is applied in the feedback loop of device 200. In the non-limiting example of FIG. 2, an amplifier 210 is included to provide gain, and may have any suitable gain factor. The amplifier 210 receives the phase-shifted output signal 208, and produces an amplified output signal 212, which is then provided to an input of the mechanical resonator 202. Thus, in some embodiments, the signal provided to the input of the mechanical resonator 202 may differ from the output of the mechanical resonator in both phase and magnitude, although not all embodiments are limited in this respect.

It should be appreciated that the inclusion and configuration of amplifier 210 for providing gain is subject to variation, and may not be included in all embodiments. For example, a gain stage could alternatively be provided in front of the phase shifter 204 (as opposed to behind the phase shifter 204), to operate directly on the output signal of the mechanical resonator 202. Alternatively, a gain stage may be implemented as part of the phase shifter 204, rather than as a distinct element. Other configurations are also possible, and the various aspects described herein are not limited to using any particular type or configuration of gain element.

In operation, if the total amount of phase shift provided by the phase shifter 204 is greater than, for example, 180 degrees, the device 200 may exhibit resonance at a frequency greater than the series resonance frequency of the mechanical resonator 202. If the total amount of phase shift provided by the phase shifter 204 is less than, for example, 180 degrees, the device 200 may exhibit resonance at a frequency lower than the series resonance frequency of the mechanical resonator 202. Thus, by varying the amount of phase shift provided by the phase shifter 204, the device 200 may be tuned on both sides of the series resonance peak of the mechanical resonator 202, as illustrated in FIG. 3.

Figure 3:
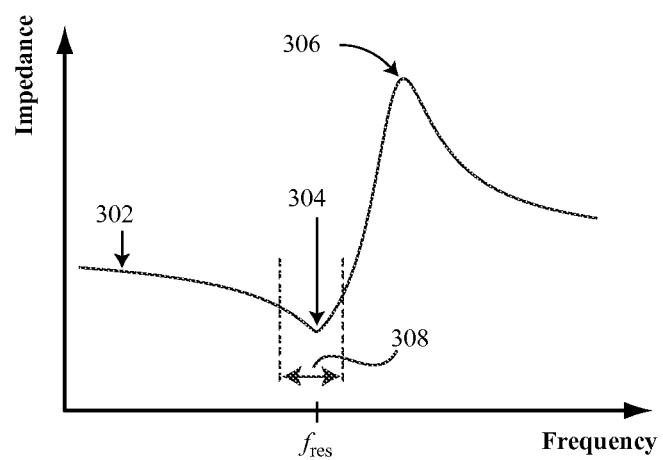
FIG. 3 shows an impedance curve for a resonator, and illustrates that tuning methods according to aspects of the technology described herein allow for tuning on both sides of the series resonance peak.

FIG. 3 is similar to FIG. 1, and illustrates an impedance curve 302 for a resonator. The impedance curve 302 includes a series resonance peak 304, occurring at a resonance frequency of the resonator, labeled as $f_{res}$, as well as a parallel resonance peak 306. The circuit and operation described above in connection with FIG. 2 allow for tuning of a device resonance frequency on both sides of the series resonance peak 304 (i.e., at frequencies greater than or less than the series resonance frequency), as illustrated by the tuning range 308. Thus, flexibility and accuracy in the tuning of a device, such as device 200, may be increased compared to conventional oscillators having mechanical resonators.

It should be appreciated that the amount of phase shift provided by phase shifter 204 may be varied, for example in those embodiments in which phase shifter 204 is a variable phase shifter. The amount of phase shift may be varied to compensate for variations in the inherent resonance frequency of the mechanical resonator 202 during operation, for example including temperature-induced variations, material-stress dependent variations, ambient pressure variations, packaging-induced stress variations, or any other types of variations. For example, a calibration routine may be performed to calibrate the amount of phase shift which phase shifter 204 should provide to compensate for a given change in temperature. Similarly, a calibration routine may be performed to calibrate the amount of phase shift provided by phase shifter 204 to the resulting change in resonance frequency of the device 200. However, it should be appreciated that other methods for determining the amount of phase shift provided by phase shifter 204 may also be used, as the various aspects described herein are not limited in this respect.

It should be appreciated that various modifications and alterations of the device 200 in FIG. 2 may be made while still providing the ability to tune the device 200 on both sides of the series resonance peak of the mechanical resonator 202. For example, according to one embodiment, the phase shifter 204 may perform a coarse phase adjustment and a fine phase adjustment of the resonator output signal 206, in which the coarse phase adjustment is larger than the fine phase adjustment. For example, in some embodiments, the amount of phase shift induced by the coarse phase adjustment may be 50 degrees or more, 90 degrees or more, 120 degrees or more, approximately 180 degrees, between approximately 90-270 degrees, between approximately 120-360 degrees, or any other suitable amount, as the various aspects described herein as implementing a coarse phase adjustment are not limited to providing any particular amount of coarse phase adjustment. The amount of phase shift induced by the fine phase adjustment may be less than that provided by the coarse phase adjustment, and may be, for example, less than approximately 5 degrees, less than approximately 10 degrees, less than approximately 20 degrees, less than approximately 1 degree, between approximately 1-10 degrees, or may be any other suitable amount, as the various aspects described herein as implementing a fine phase adjustment are not limited to providing any particular amount of fine phase adjustment. The coarse and/or fine phase adjustment may be provided in increments of 1 degree, 5 degrees, 10 degrees, a fraction of a degree, or in any other suitable increments, as the various aspects described herein are not limited in this respect.

Figure 4A:
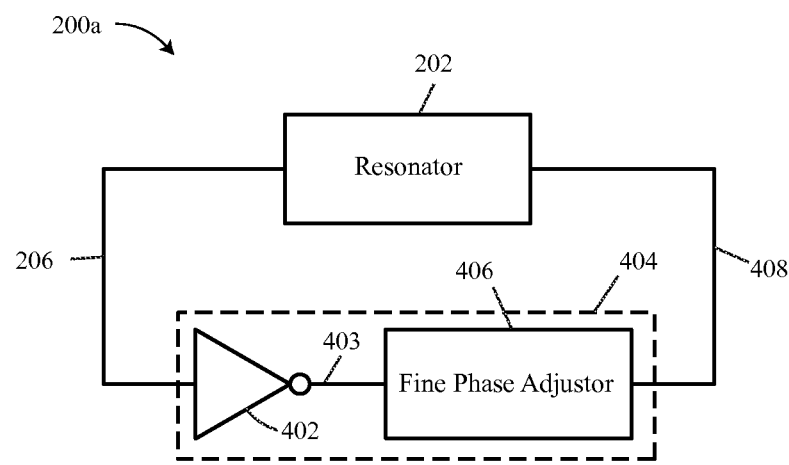
FIGS. 4A-4B illustrate alternative implementations of an electromechanical circuit having a mechanical resonator and a phase shifter, in which the phase shifter includes a coarse phase adjustor and a fine phase adjustor, according to alternative embodiments of the technology.

Device 200a, which is a variation of the device 200, is shown in FIG. 4A, and comprises a phase shifter 404 having an inverting amplifier 402 and a fine phase adjustor 406. The inverting amplifier 402 may function as a coarse phase adjustor, for example receiving the output signal 206 of the mechanical resonator 202 and providing an inverted version 403 of that signal, therefore having a phase shift of approximately 180 degrees from the phase of the output signal 206 of the resonator 202. The output signal 403 of the inverting amplifier 402 may then be provided to the fine phase adjustor 406, which may further adjust the phase by an additional amount, for example by one degree, five degrees, ten degrees, fifteen degrees, a fraction of a degree, or any other suitable amount, to produce the phase-shifted signal 408, which may be provided to an input of the mechanical resonator 202.

It should be appreciated that the device 200a does not include the amplifier 210, since the inverting amplifier 402 may provide gain within the feedback loop. However, not all embodiments are limited in this respect, as any number of gain elements may be included in the feedback loop of a device having a mechanical resonator and a phase shifter.

Figure 4B:
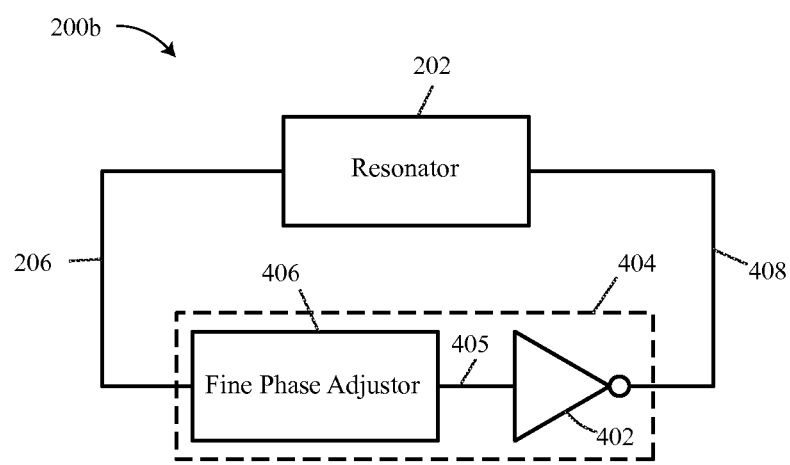

It should further be appreciated that the order in which the coarse phase adjustment and the fine phase adjustment are performed in device 200a is not limiting. For example, FIG. 4A illustrates that the coarse phase adjustment, i.e., the 180 degree phase adjustment provided by inverting amplifier 402, occurs prior to the fine phase adjustment provided by the fine phase adjustor 406. However, as shown in FIG. 4B, the order of the inverting amplifier 402 and the fine phase adjustor 406 may be reversed in a device 200b, such that the fine phase adjustment is performed on the output signal 206 of the resonator 202, with the fine phase-adjusted output signal 405 of the fine phase adjustor being provided to the inverting amplifier 402. The output signal of the inverting amplifier, which may therefore correspond to the phase-shifted signal 408, may then be provided to an input of the mechanical resonator 202.

According to another embodiment, an electromechanical device (e.g., an oscillator, a filter, a sensor, or any other suitable device) comprises a mechanical resonator, an electronic drive circuit, and an LC tuning subcircuit. The LC tuning subcircuit may comprise an inductor and a capacitor, one or both of which may be variable, and may facilitate tuning of the device resonance frequency on both sides of the series resonance frequency of the mechanical resonator.

Figure 5:
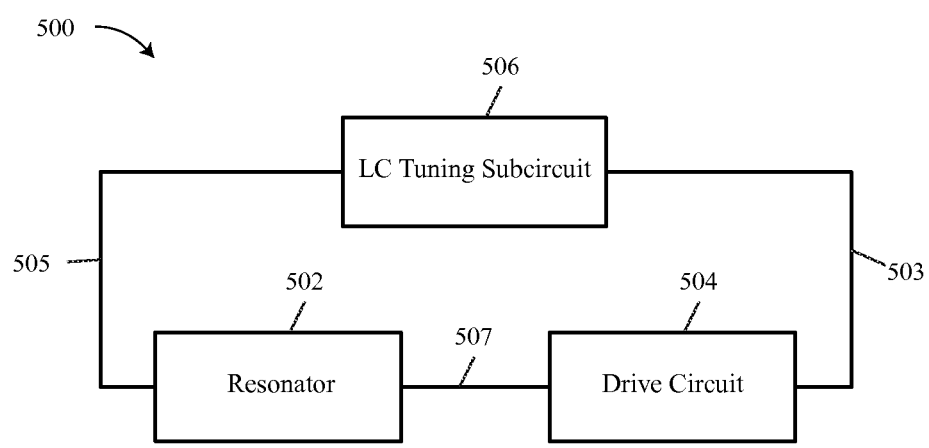
FIG. 5 is a schematic diagram of a device comprising a mechanical resonator, a drive circuit, and an LC tuning subcircuit, according to one embodiment of the technology.

FIG. 5 illustrates one non-limiting example of an electromechanical device 500 comprising a mechanical resonator 502 coupled to a drive circuit 504. The drive circuit 504 provides a drive signal 503 (e.g., an oscillating drive signal (e.g., an AC signal), or any other suitable drive signal) to an LC tuning subcircuit 506, which then provides an output signal 505 to the mechanical resonator 502. The output signal 507 of the mechanical resonator is then provided to an input of the drive circuit 504.

According to some embodiments, the LC tuning subcircuit 506 may be variable, such that the reactance of that subcircuit may be varied to adjust the resonance frequency of the device 500. The LC tuning subcircuit may therefore take any suitable form, one non-limiting example of which is described below in connection with FIG. 6.

The mechanical resonator 502 may be any type of mechanical resonator, such as any of the types mentioned in regard to mechanical resonator 202, above, or any other suitable type of resonator. In some embodiments, micromechanical resonators may be preferred. For example, micromechanical resonators may have a large dimension (e.g., the largest of length, width, thickness, or other dimension depending on the geometry of the mechanical resonator) of less than 100 microns, or may have any other suitable dimension(s). The drive circuit 504 may be any suitable drive circuit for driving the resonator 502, for example at or near the series resonance frequency of the mechanical resonator 502.

Figure 6:
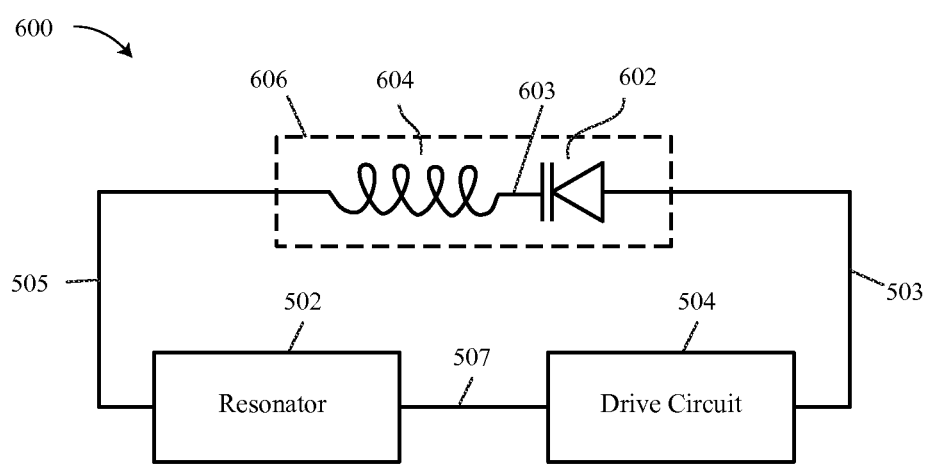
FIG. 6 illustrates one example of an implementation of the device of FIG. 5, in which the LC tuning subcircuit includes a variable capacitor.

FIG. 6 illustrates one non-limiting implementation of a device having a mechanical resonator and an LC tuning subcircuit (such as device 500 of FIG. 5), in which the LC tuning subcircuit includes a variable capacitor and a fixed value inductor. As shown, the device 600 comprises the drive circuit 504, an LC tuning subcircuit 606, and the mechanical resonator 502. In this non-limiting embodiment, the LC tuning subcircuit 606 comprises a variable capacitor 602, which receives the drive signal 503 from the drive circuit 504 and produces an output signal 603. The LC tuning subcircuit further comprises an inductor 604, which in the non-limiting example of FIG. 6 is a fixed value inductor. The inductor 604 receives the output signal 603 from the variable capacitor 602 and produces the output signal 505, which is provided to the mechanical resonator.

In some embodiments of electromechanical devices employing an LC tuning subcircuit (e.g., LC tuning subcircuit 606), any inductors and/or capacitors of the LC tuning subcircuit are distinct from any parasitic inductance and parasitic capacitance of the mechanical resonator of the electromechanical device. In some embodiments, any inductors and/or capacitors of the LC tuning subcircuit have larger values than any parasitic inductances and/or capacitances of the mechanical resonator. For example, in some embodiments, the inductance of an inductor of an LC tuning subcircuit is approximately twice as great as any parasitic inductance of the mechanical resonator, is approximately 1.5-3 times as great, is approximately five times or more (e.g., ten times, 15 times, or any other suitable amount) greater than any parasitic inductance of the mechanical resonator, or has any other suitable value. Similarly, in some embodiments, the capacitance of a capacitor of an LC tuning subcircuit is approximately twice as great as any parasitic capacitance of the mechanical resonator, is approximately 1.5-3 times as great, is approximately five times or more (e.g., ten times, 15 times, or any other suitable amount) greater than any parasitic capacitance of the mechanical resonator, or has any other suitable value.

In operation, the capacitance of the variable capacitor 602 may be varied to adjust a total impedance value of the device 600, for example to minimize the total impedance of the device 600 to achieve resonant behavior. The variable capacitor 602 may be any suitable type of variable capacitor, and therefore its capacitance value may be varied in any suitable manner.

The variable capacitor 602 and the inductor 604 may have any suitable values. For example, according to one non-limiting embodiment, the inductance value of the inductor 604 may be selected such that the reactance of the inductor 604 at a particular frequency is midway between the lower and upper reactances of the variable capacitor at that frequency. As an example, the variable capacitor may have a capacitance which may be varied between 10 and 20 picoFarads, as just one non-limiting example, such that the reactance of the variable capacitor may be varied between an upper reactance value (i.e., when the capacitance is 10 picoFarad) and a lower reactance value (i.e., when the capacitance has a value of 20 picoFarads). The inductance value of inductor 604 may be chosen, for example by suitable design, so that the reactance of the inductor is approximately equal to the midpoint between the lower and upper reactance values of the variable capacitor. It should be appreciated that the actual values of the inductor and capacitor may be chosen appropriately for a desired application, and that the examples given above (e.g., 10 picoFarads for the capacitor) are merely non-limiting examples for purposes of illustration.

The variable capacitor 602 and the inductor 604 may take any suitable form. For example, they may be implemented as discrete electrical components, may be integrated with other components of the device (e.g., as transmission lines, or otherwise), or may be formed in any other suitable manner, as the various aspects described herein are not limited in this respect.

Figure 8:
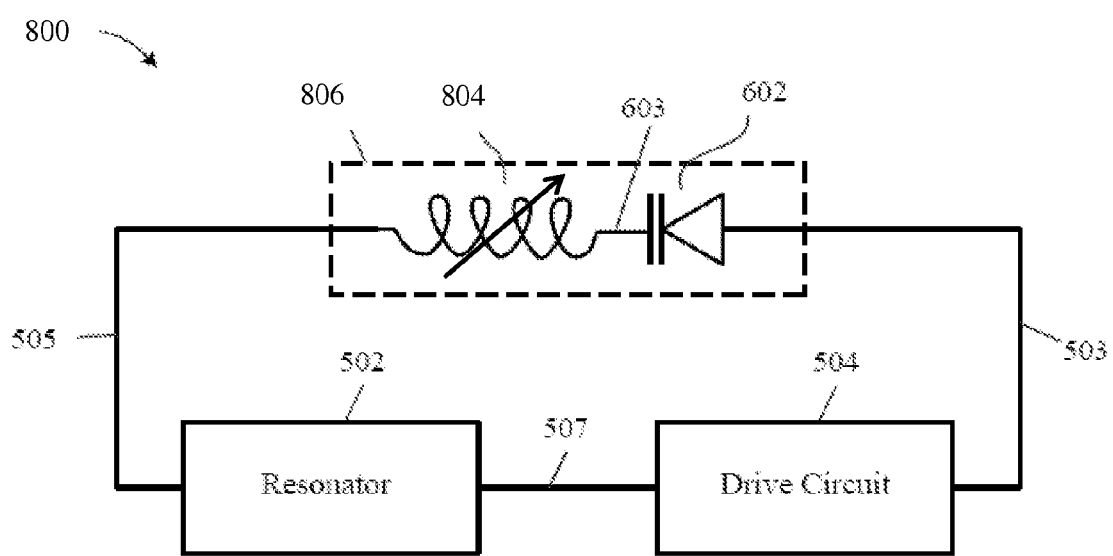
FIG. 8 illustrates an alternative example of an implementation of the device of FIG. 5, in which the LC tuning subcircuit includes a variable inductor and a variable capacitor.

It should further be appreciated that various alterations on the devices 500 and 600 are possible. For example, according to one embodiment, a device comprises an LC tuning subcircuit (e.g., LC tuning subcircuit 506) having a variable inductor and a fixed value capacitor. Alternatively, according to another embodiment, a device comprises an LC tuning subcircuit (e.g., LC tuning subcircuit 506) having both a variable inductor and a variable capacitor. For example, FIG. 8 illustrates a device 800 similar to the device 600 of FIG. 6, in which the LC tuning subcircuit 806 includes a variable inductor 804.

In any of the scenarios discussed, suitable adjustment of the relative values of an inductor and capacitor of an LC tuning subcircuit may allow for tuning of the device comprising the LC tuning subcircuit on both sides of the series resonance frequency of the mechanical resonator of the device, as shown and described previously in connection with FIG. 3.

Figure 7:
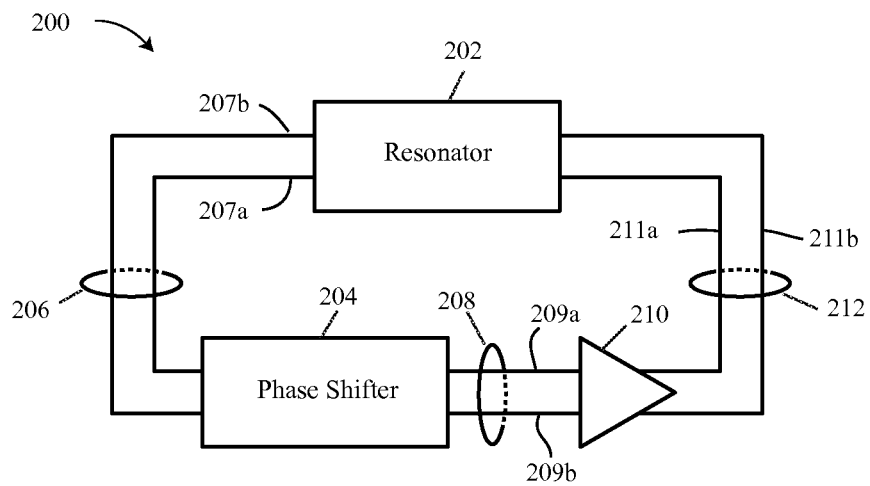
FIG. 7 illustrates the feedback loop of FIG. 2 in connection with multi-ended signals, according to one embodiment.

It should be appreciated from the foregoing that the various techniques and circuits described herein may be applied to and work with various types of signals. For example, the signals may be single-ended signals, differential signals, three-phase signals, or any other suitable types of signals. Also, the techniques may apply with various excitation schemes of the mechanical resonator, including, but not limited to, (a) differential-to-differential; (b) single-ended-to-single-ended; (c) single-ended-to-differential; or (d) differential-to-single-ended. FIG. 7 illustrates a non-limiting example.

As shown in FIG. 7, the device 200 of FIG. 2 may operate on differential signals (i.e., signals having equal and opposite magnitude) or modified differential signals (i.e., signals having two ends, which may not be equal and opposite in magnitude). Thus, the output signal 206 of the mechanical resonator may include two ends, 207a and 207b, where the "ends" of the output signal 206 are the two distinct signals making up the output signal. The output signal 206 may be a differential signal, with the two ends 207a and 207b being equal and opposite in magnitude. However, the embodiment of FIG. 7 is not limited in this respect. Similarly, the phase-shifted output signal 208 may include two ends, 209a and 209b. The end 209a may correspond to the end 207a of output signal 206. Likewise, the end 209b may correspond to the end 207b of output signal 206. The amplifier 210 may receive the two ends, 209a and 209b, of phase-shifted output signal 208, and produce the amplified output signal 212. The amplified output signal 212 may include two ends, 211a and 211b, corresponding to ends 209a and 209b, respectively.

Again, it should be appreciated that the other techniques and circuits described in this application (e.g., other than the device 200) may also implement signals having multiple (two or more) ends, and that the various aspects of the technology are not limited in this respect.

According to one aspect of the technology, a mechanical resonator provides an output signal having multiple ends (e.g., a differential output signal), the phases of which are then shifted by equal amounts. According to another aspect of the technology, a mechanical resonator provides an output signal having multiple ends, the phases of two or more of which are then shifted by differing amounts. For example, referring to FIG. 7, the phase of end 207a may be shifted by phase shifter 204 by a different amount than that by which the phase of end 207b is shifted. As a result, the phase-shifted output signal 208 may include ends 209a and 209b having different phases from each other. The ends 211a and 211b of the amplified output signal 212 may therefore also have different phases from each other, such that they are fed back into the resonator 202 as an input signal having ends with different phases from each other.

The above-described technique of shifting the phases of the ends of a mechanical resonator output signal by differing amounts and then providing an input signal to the mechanical resonator, with the input signal including two or more ends having differing phases, may be performed for any reason. According to some embodiments, such a technique may be used to provide a constant (or approximately constant) input power to the resonator 202. For example, by shifting the phases of the ends of a resonator input signal relative to each other, a constant power of the input signal may be achieved, facilitating efficient operation of the resonator, for example if the input power is maintained approximately constant at a value equal to (or approximately equal to) the maximum input power which the resonator may tolerate.

According to those embodiments in which a resonator output signal has multiple ends and two or more of those ends have their phases shifted by different amounts, the difference in amount of phase shift may take any suitable value(s), and may be static or variable. For example, referring to FIG. 7, the phase of end 207a may be shifted by a first amount to produce end 209a and the phase of end 207b may be shifted by a second amount to produce end 209b. In some embodiments, the first amount and second amount may differ from each other by between approximately 0 and 20 degrees. In some embodiments, the first amount and second amount may differ from each by between approximately 0 and 10 degrees (e.g., 1 degree, 2 degrees, 5 degrees, etc.). In some embodiments, the first amount and second amount may differ from each by between 10 and 20 degrees (e.g., 15 degrees). Other ranges and other values for the difference in phase shift may be employed, as the aspects described herein relating to shifting the ends of a resonator output signal by differing amounts are not limited to using any particular differing amount. Also, it should be appreciated that phase shifting the ends of a signal by differing amounts may be accomplished by shifting one of the ends and not shifting another (i.e., phase shifting one end by a non-zero amount and introducing no phase-shift in the other). In addition, as mentioned, the amount of difference may be changed over time.

In addition, it should be appreciated that the above-described techniques for shifting the ends of a resonator output signal by differing amounts may apply to any number of ends of a resonator output signal. For example, if the resonator outputs a 3-phase signal, two or more of the ends may have their phases shifted by different amounts, and then provided to the resonator as an input signal. Thus, the techniques described are not limited to use with any particular types of signals (e.g., single-ended signals, differential signals, modified differential signals, 3-phase signals, etc.).

In addition to shifting the phase(s) of signals of the mechanical resonator, the amplitude(s) may be shifted. For example, according to one embodiment, two ends of a differential output signal of a mechanical resonator may be phase shifted relative to each other (i.e., so there is a phase difference between the two ends) and the amplitudes of the two ends may be different (e.g., by applying different gains to the ends). The two ends may then be fed back to the mechanical resonator as input signals. The difference in amplitudes of the two ends may further contribute to the resulting phase shift of the input signal to the mechanical resonator comprising the two ends. Thus, the amplitude of the signals may be controlled to further facilitate tuning of the mechanical resonator. Thus, it should be appreciated that a combination of phase-shifting and amplitude adjusting of ends of a signal (e.g., an input signal to the mechanical resonator) may be performed to generate a desired phase difference between the ends. According to one embodiment, an output signal from a mechanical resonator may comprise a first end and a second end, which may then be phase shifted and amplified by different amounts to create a modified signal supplied to the mechanical resonator as an input signal. Other manners of operation are also possible.

As mentioned, one or more of the apparatus and techniques described above may provide accuracy and flexibility in tuning of a device. For example, according to some embodiments, the tuning range of a device (e.g., tuning range 308) may be approximately 700 parts-per-million (ppm) of the resonance frequency of the device and/or the mechanical resonator (which may be, for example, any of the resonance frequencies listed below, or any other suitable resonance frequency), may be at least 300 ppm of the resonance frequency, may be at least 400 ppm of the resonance frequency, may be at least 500 ppm of the resonance frequency, may be up to 1500 ppm of the resonance frequency, may range from 300-800 ppm of the resonance frequency (e.g., between approximately 400 and 600 ppm, between approximately 500 and 700 ppm, between approximately 600-800 ppm), may range from 5-200 ppm (e.g., between approximately 50-100 ppm), or may have other values. Also, as mentioned, the ability to adjust the resonance frequency of a device on both sides of a series resonance frequency of a mechanical resonator may relax design constraints on the mechanical resonator, since any deviation of the inherent resonance frequency of the mechanical resonator from a desired value may be compensated for by suitable tuning. Similarly, temperature-induced variations, package-induced variations, and/or material stress induced variations in the resonance frequency of the mechanical resonator may be compensated for using one or more of the techniques described above.

According to some embodiments, one or more of the circuits and methods described above may be implemented as a MEMS, a NEMS, or any other suitable device. For example, one or more of the components of the devices shown in FIGS. 2, 4A-4B, and 5-7 may form part, or all, of a MEMS. However, it should be appreciated that the apparatus and methods described herein are not limited to use with MEMS, NEMS, or any other particular structures. As such, other configurations are also possible.

According to some embodiments, the mechanical resonators and/or devices described herein may be packaged. As a result, in some embodiments, the resonance frequency of the mechanical resonators and/or devices may be subject to package-induced stresses, and the tuning methods described herein may be used to compensate for such stresses.

According to some embodiments, the tuning methods described herein may be used in combination with other tuning methods, including but not limited to stress tuning, either by electrostatic techniques or piezoelectric techniques. Other types of tuning are also possible, as the various aspects described herein are not limited to being used as the sole type of tuning of a device.

As mentioned, the various aspects described herein including mechanical resonators are not limited to use with any particular type of mechanical resonator. It should be appreciated that the mechanical resonators (e.g., mechanical resonators 202 and 502) may be of any suitable type, as the various aspects of the technology are not limited in this respect. Thus, aspects of the technology may apply to devices having mechanical resonators of various materials/compositions, shapes, sizes, and/or methods of actuation and/or detection.

For example, the mechanical resonator may comprise or be formed of any suitable material(s) and may have any composition. According to some embodiments, the mechanical resonator may comprise or be formed of a piezoelectric material. According to some embodiments, the mechanical resonator comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonator comprises a piezoelectric material, the piezoelectric material may be single crystal material. According to some embodiments, the mechanical resonator may comprise a base on which additional structures (e.g., electrodes) are formed, and the base may comprise any of those materials listed, or any other suitable materials.

According to some embodiments, the mechanical resonator comprises or is formed of multiple layers, making the structure a composite structure. For example, a mechanical resonator may comprise a base on which electrodes are formed, thus making the structure a composite structure. In addition, or alternatively, the base itself may comprise one or more layers of differing materials, shapes, and/or thicknesses. For example, the base of the mechanical resonator may comprise an active layer and one or more insulating layers.

The mechanical resonator may have any shape. For example, aspects of the technology may apply to mechanical resonators that are substantially rectangular, substantially ring-shaped, substantially disc-shaped, or that have any other suitable shape. Moreover, the mechanical resonator may have one or more beveled edges. According to some embodiments, the mechanical resonator may be substantially planar.

The mechanical resonator may have any suitable dimensions. According to some embodiments, the mechanical resonator has a thickness T, which in some embodiments is less than approximately three wavelengths of a resonance frequency of interest of the mechanical resonator. According to some embodiments, the thickness is less than approximately two wavelengths of the resonance frequency of interest. In still other embodiments, the thickness may be less than approximately one wavelength of the resonance frequency of interest (e.g., less than approximately one wavelength of a resonant Lamb wave supported by the mechanical resonator). The thickness may determine or depend on the types of waves supported by the mechanical resonator. For example, a given thickness may limit the ability of the mechanical resonator to support Lamb waves, or certain modes of Lamb waves. Thus, it should be appreciated that the thickness may be chosen in dependence on the types and/or modes of waves desired to be supported by the mechanical resonator. It should also be appreciated that thickness values other than those listed may be suitable for some applications, and that the various aspects described herein are not limited to using mechanical resonators having any particular thickness values.

According to some embodiments, the mechanical resonator may have a large dimension (e.g., the largest of length, width, diameter, circumference, etc.) of less than approximately 1000 microns, less than 100 microns, less than 50 microns, or any other suitable value. It should be appreciated that other sizes are also possible. According to some embodiments, the devices described herein form part or all of a microelectromechanical system (MEMS).

The mechanical resonator may have any desired resonance frequency or frequencies, as the various aspects described herein are not limited to use with structures having any particular operating range or resonance frequency. For example, the resonance frequency of the mechanical resonators and/or devices described herein may be between 1 kHz and 10 GHz. In some embodiments, the frequencies of operation of the devices and/or mechanical resonators are in the upper MHz range (e.g., greater than 100 MHz), or at least 1 GHz (e.g., between 1 GHz and 10 GHz). In some embodiments, the output signal produced by a mechanical resonator may have a frequency of at least 1 MHz (e.g., 13 MHz, 26 MHz) or, in some cases, at least 32 kHz. In some embodiments, the operating frequency may range from 30 to 35 kHz, 60 to 70 kHz, 1-10 MHz, 10 MHz to 1 GHz, 1 GHz to 3 GHz, 3 GHz to 10 GHz, or any other suitable frequencies.

The mechanical resonators may be actuated and/or detected in any suitable manner, with the particular type of actuation and/or detection depending on the type of mechanical resonator, the desired operating characteristics, or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the devices described herein may be piezoelectric Lamb wave devices, such as piezoelectric Lamb wave resonators. Such Lamb wave devices may operate based on propagating acoustic waves, with the edges of the mechanical resonator serving as reflectors for the waves. For such devices, the spacing between the resonator edges may define the resonance cavity, and resonance may be achieved when the cavity is an integer multiple of p, where p=λ/2, with λ being the acoustic wavelength of the Lamb wave. However, it should be appreciated that aspects of the technology described herein apply to other types of structures as well, and that Lamb wave structures are merely non-limiting examples.

In some embodiments including mechanical resonators, the mechanical resonators may be suspended, in that they may have one or more segments which are not directly attached to any other structures. It should be appreciated that various forms of "suspended" structures may be used, including, but not limited to, structures having any one or more free surfaces.

In some embodiments, mechanical resonators such as those described herein may include one or more electrodes, for example to actuate the mechanical resonator. In such embodiments, the mechanical resonator may have any suitable type, number, and configuration of electrodes. For example, the electrodes may be formed of any suitable material. Any number of electrodes may be included. For example, in some embodiments, one electrode is connected to each of an input port and an output port to drive and sense the operation of the mechanical resonator. In other embodiments, more than one electrode may be connected to each electrical port. In some embodiments, the electrodes are individual strips. However, the electrodes may take any suitable shape. The electrodes may extend along substantially the entire width W of a mechanical resonator, or may alternatively extend along only a part of the width (e.g., half the width, a quarter of the width, etc.). Other configurations are also possible, as the various structures herein including electrodes are not limited to any particular number, shapes, or configurations of electrodes, unless so stated.

Having described several embodiments of various aspects of the technology in detail, various modifications and improvements will readily occur to those skilled in the art. Such modifications and improvements are intended to be within the spirit and scope of the various aspects of the technology. Accordingly, the foregoing description is by way of example only, and is not intended as limiting. The technology is limited only as defined by the following claims and the equivalents thereto.

What is claimed is:

1. A device, comprising:
   a mechanical resonator having a series resonance frequency, the mechanical resonator comprising:
      a layer comprising a piezoelectric material and having a thickness less than three wavelengths of the series resonance frequency; and
      multiple electrodes formed on the layer,
      wherein the mechanical resonator is configured to support Lamb waves, and
   a drive circuit coupled to the mechanical resonator and configured to produce a drive signal for driving the mechanical resonator; and
   a tuner coupled to the mechanical resonator and configured to be able to adjust an operating frequency of the device to frequencies less than and greater than the series resonance frequency,
   wherein the tuner comprises an LC tuning subcircuit comprising a variable inductor and a variable capacitor,
   wherein the mechanical resonator, variable inductor, and variable capacitor are connected in series,
   wherein the tuner is configured to adjust the operating frequency of the device over a range of at least 400 parts per million of the series resonance frequency, and
   wherein an output of the drive circuit is connected to an input of the variable capacitor, an output of the variable capacitor is connected to an input of the variable inductor, an output of the variable inductor is connected to an input of the mechanical resonator, and an output of the mechanical resonator is connected to an input of the drive circuit.

2. The device of claim 1, wherein the tuner is configured to adjust the operating frequency of the device over a range of at least 500 parts per million of the series resonance frequency.

3. The device of claim 2, wherein the tuner is configured to adjust the operating frequency of the device over a range of between 500 parts per million and 700 parts per million of the series resonance frequency.

4. The device of claim 3, wherein the tuner is configured to adjust the operating frequency of the device over a range of between 600 parts per million and 800 parts per million of the series resonance frequency.

5. The device of claim 1, wherein the piezoelectric material is aluminum nitride.

6. The device of claim 1, wherein the operating frequency of the device is between 100 MHz and 1 GHz.

* * * * *